United States Patent
Lubomirsky et al.

(10) Patent No.: US 9,948,214 B2
(45) Date of Patent: Apr. 17, 2018

(54) HIGH TEMPERATURE ELECTROSTATIC CHUCK WITH REAL-TIME HEAT ZONE REGULATING CAPABILITY

(71) Applicant: Applied Materials, Inc., Santa Clara, CA (US)

(72) Inventors: Dmitry Lubomirsky, Cupertino, CA (US); Jennifer Y. Sun, Mountain View, CA (US); Sehn Thach, Union City, CA (US); Xing Lin, West Babylon, NY (US); Michael D. Willwerth, Campbell, CA (US); Konstantin Makhratchev, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 726 days.

(21) Appl. No.: 13/793,512

(22) Filed: Mar. 11, 2013

(65) Prior Publication Data
US 2013/0284374 A1   Oct. 31, 2013

Related U.S. Application Data

(60) Provisional application No. 61/639,719, filed on Apr. 27, 2012, provisional application No. 61/639,228, (Continued)

(51) Int. Cl.
*H02N 13/00* (2006.01)
*H01L 21/67* (2006.01)
(Continued)

(52) U.S. Cl.
CPC ...... *H02N 13/00* (2013.01); *H01L 21/67103* (2013.01); *H01L 21/67109* (2013.01);
(Continued)

(58) Field of Classification Search
USPC ........ 279/128; 361/234; 156/345.51, 345.52, 156/345.53; 118/725, 724
See application file for complete search history.

(56) References Cited

U.S. PATENT DOCUMENTS 4,869,801 A * 9/1989 Helms ............... C23C 14/50
156/345.39
5,063,031 A * 11/1991 Sato ............... C23C 16/4584
118/725
(Continued)

FOREIGN PATENT DOCUMENTS

CN           101818333 A       9/2010

OTHER PUBLICATIONS

International Search Report, PCT Application No. PCT/US2013/034380, dated Jul. 10, 2013.
(Continued)

*Primary Examiner* — Sylvia R MacArthur
(74) *Attorney, Agent, or Firm* — Patterson + Sheridan LLP

(57) ABSTRACT

Embodiments of the present invention provide electrostatic chucks for operating at elevated temperatures. One embodiment of the present invention provides a dielectric chuck body for an electrostatic chuck. The dielectric chuck body includes a substrate supporting plate having a top surface for receiving a substrate and a back surface opposing the top surface, an electrode embedded in the substrate supporting plate, and a shaft having a first end attached to the back surface of the substrate supporting plate and a second end opposing the first end. The second end is configured to contact a cooling base and provide temperature control to the substrate supporting plate. The shaft is hollow having a sidewall enclosing a central opening, and two or more
(Continued)

channels formed through the sidewall and extending from the first end to the second end.

21 Claims, 3 Drawing Sheets

Related U.S. Application Data filed on Apr. 27, 2012, provisional application No. 61/638,857, filed on Apr. 26, 2012.

(51) Int. Cl.
  *H01L 21/683* (2006.01)
  *H01L 21/687* (2006.01)
  *B23B 31/28* (2006.01)

(52) U.S. Cl.
  CPC .... *H01L 21/67248* (2013.01); *H01L 21/6831* (2013.01); *H01L 21/68792* (2013.01); *B23B 31/28* (2013.01)

(56) References Cited

U.S. PATENT DOCUMENTS

| | | | |
|---|---|---|---|
| 6,160,244 A * | 12/2000 | Ohashi | H01L 21/67098 118/725 |
| 6,313,443 B1 * | 11/2001 | Harnik | H01L 21/67098 118/724 |
| 6,853,533 B2 * | 2/2005 | Parkhe | H01L 21/67248 361/234 |
| 9,150,981 B2 * | 10/2015 | Suzuki | C23C 16/46 |
| 2002/0050246 A1 * | 5/2002 | Parkhe | H01L 21/67248 118/500 |
| 2003/0213436 A1 * | 11/2003 | Kwon | C23C 16/34 118/725 |
| 2004/0097088 A1 | 5/2004 | Kitayama et al. | |
| 2009/0236315 A1 * | 9/2009 | Willwerth | H01J 37/32522 216/67 |
| 2009/0274590 A1 * | 11/2009 | Willwerth | H01L 21/68792 422/186.04 |
| 2010/0018648 A1 * | 1/2010 | Collins | H01J 37/32082 156/345.24 |
| 2010/0101728 A1 | 4/2010 | Iwasaki | |
| 2010/0136773 A1 | 6/2010 | Akae et al. | |
| 2010/0229794 A1 * | 9/2010 | Iso | C23C 16/303 118/725 |
| 2011/0034034 A1 | 2/2011 | Du Bois et al. | |
| 2012/0067845 A1 | 3/2012 | Monden et al. | |
| 2013/0284374 A1 * | 10/2013 | Lubomirsky | H02N 13/00 156/345.51 |

OTHER PUBLICATIONS

Office Action from Chinese Patent Application No. 201380016503.1 dated May 24, 2016.
Office Action from Chinese Patent Application Serial No. 201380016503.1 dated Dec. 5, 2016.

* cited by examiner

HIGH TEMPERATURE ELECTROSTATIC CHUCK WITH REAL-TIME HEAT ZONE REGULATING CAPABILITY

CROSS-REFERENCE TO RELATED APPLICATIONS

This application claims benefit of U.S. Provisional Patent Application Ser. No. 61/638,857 filed Apr. 26, 2012, Ser. No. 61/639,228 filed Apr. 27, 2012 and Ser. No. 61/639,719 filed Apr. 27, 2012. The aforementioned patent applications are herein incorporated by reference.

BACKGROUND

Field

Embodiments of the present invention generally relate to apparatus and methods for processing substrate at high temperature. Particularly, embodiments of the present invention relate to apparatus and methods for supporting a substrate in a processing chamber operating at high temperatures.

Description of the Related Art

Electrostatic chucks are commonly used in supporting and securing a substrate in a processing chamber. An electrostatic chuck generally has a non-conductive body, such as a ceramic body, having an embedded DC electrode for generating chucking force. One or more heating element may be included in the substrate support to provide heating during processing. An RF electrode may be embedded inside a non-conductive body. The RF electrode delivers bias power to generate plasma while the DC electrode generates chucking force for securing a substrate thereon. A heater may be embedded in the non-conductive body to provide heating. A cooling base may be attached to non-conductive body to cool the non-conductive body. The heater and the cooling base work together to control the temperature of the electrostatic chuck and the substrate supported thereon.

Existing electrostatic chucks generally have metal clamping devices to secure the non-conductive body and the cooling base and use organic O-rings to provide sealing. However, the metal clamping devices and organic O-rings cannot function properly at elevated temperatures, such as at a temperature higher than 350° C. At 350° C., the operating temperature exceeds the performance limits for high temperature organic O-Rings. At elevated temperatures, metal clamping devices constrain thermal expansion of the non-conductive body and the cooling base. Additionally, metal clamping devices, generally made from refractory metal such as titanium, will also introduce metal contamination under processing chemistry.

Therefore, there is a need for electrostatic chuck for operating at elevated temperatures.

SUMMARY

Embodiments of the present invention relate to apparatus and methods for supporting a substrate in a processing chamber operating at high temperatures. Particularly, embodiments of the present invention provide electrostatic chucks for operating at elevated temperatures.

One embodiment of the present invention provides a dielectric chuck body for an electrostatic chuck. The dielectric chuck body includes a substrate supporting plate having a top surface for receiving a substrate and a back surface opposing the top surface, an electrode embedded in the substrate supporting plate and configured to generate chucking force for securing the substrate on the top surface and/or to generate plasma for processing, and a shaft having a first end attached to the back surface of the substrate supporting plate and a second end opposing the first end. The second end is configured to contact a cooling base and provide temperature control to the substrate supporting plate. The shaft is hollow having a sidewall enclosing a central opening, and two or more channels formed through the sidewall and extending from the first end to the second end.

Another embodiment of the present invention provides an electrostatic chuck assembly. The electrostatic chuck assembly includes a dielectric chuck body according to one embodiment of the present invention, and a cooling base configured to provide temperature control to the dielectric chuck body. The cooling base and the dielectric chuck body are coupled together at the second end of the shaft of the dielectric chuck body. A gap is formed between the back surface of the substrate supporting plate and a top surface of the cooling base.

Another embodiment of the present invention provides an apparatus for processing a substrate. The apparatus includes a chamber housing assembly defining an inner volume, an electrostatic chuck assembly according to one embodiment of the present invention disposed in the inner volume and configured to secure and support a substrate in the inner volume during processing. The apparatus further includes a gas injection assembly configured to deliver one or more processing gas over the substrate disposed on the electrostatic chuck assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention relate to apparatus and methods for supporting a substrate in a processing chamber operating at elevated temperatures. More particularly, embodiments of the present invention provide an electrostatic chuck assembly for operating at elevated temperatures. One embodiment provides a dielectric chuck body having a dielectric disk and a shaft extending from the dielectric disk. The shaft is hollow and has a central opening providing passage for connectors to an RF, a DC or an RF/DC combined electrode and/or heating elements embedded in dielectric disk. The shaft also has one or more channels formed through a sidewall along the axial direction. The one or more channels may be used to provide integrated passages for cooling fluids and/or substrate sensor passages or connections. By using the channels formed in the sidewall of the shaft, embodiments of the present invention avoid sealing cooling fluid passages using o-rings which may not withstand high temperature.

Embodiments of the present invention further provide a cooling base attached to the dielectric chuck body at a distal end of the shaft to provide temperature control to the dielectric chuck body. No clamping is applied between the cooling base and an edge of the supporting disk of the dielectric chuck body. By attaching the cooling base and the dielectric chuck body at the distal end of the shaft and avoiding clamping to the edge of the supporting disk, embodiments of the present invention eliminate restrains to thermal expansion in the structure, and also reduce particle generation caused by conventional clamping structures.

Embodiments of the present invention include enabling an electrostatic chuck to perform at high temperatures. For example, electrostatic chuck according to embodiments of the present invention may operate in an etching environment maintained at a temperature of up to about 400 degrees Celsius. Certain embodiments of the present invention also provide a two zone temperature control to achieve a target substrate temperature profile. Embodiments of the present invention also eliminate metal contamination associated with from metal clamping structures used in traditional electrostatic chucks to secure a dielectric chuck body to a cooling base. Embodiments of the present invention also provide integrated passages for cooling fluids and/or leads to sensors and eliminate usages of sealing o-rings which may not withstand high temperatures. Certain embodiments of the present invention also provide a wafer temperature monitoring (WTM) system that improves process quality.

Figure 1:
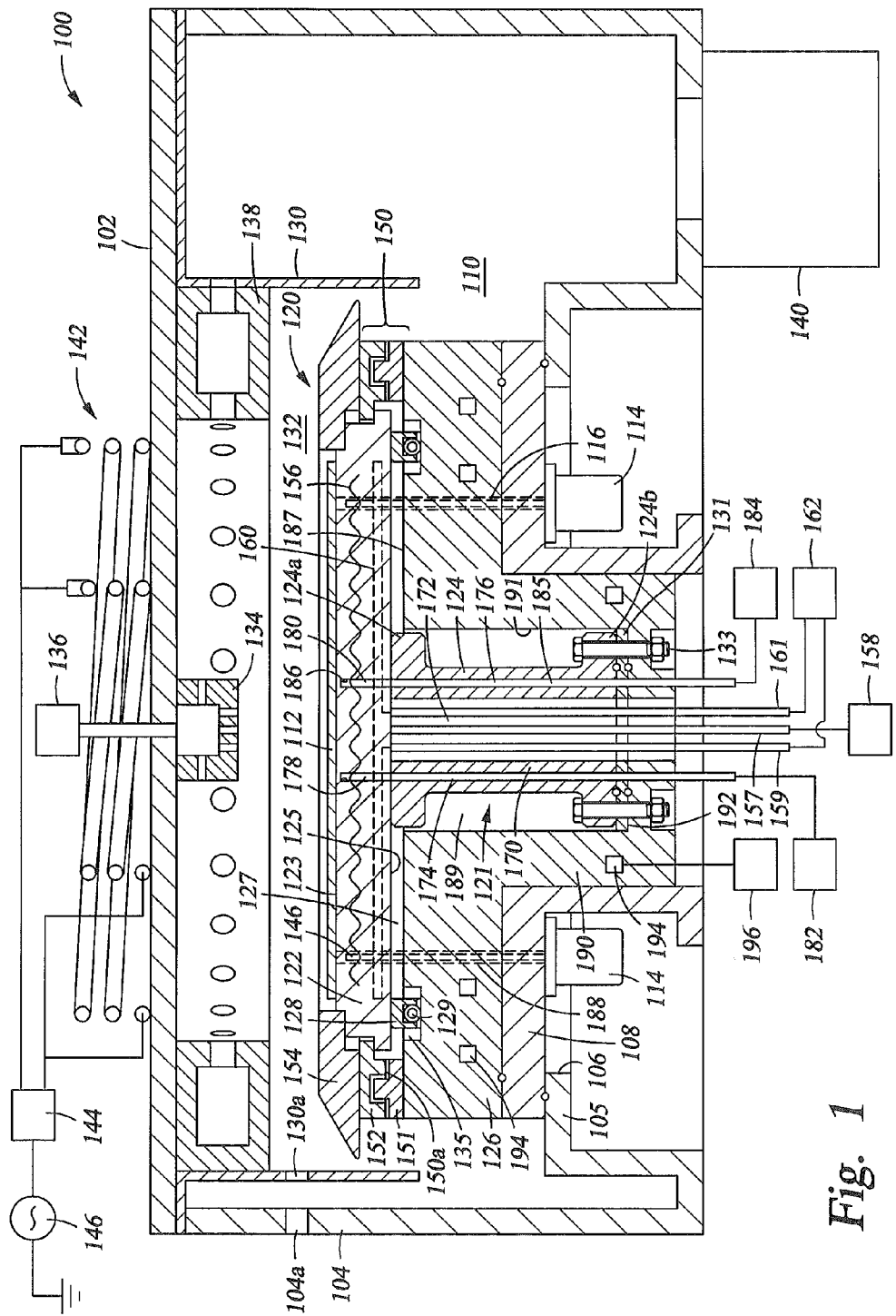
FIG. 1 is a sectional side view of a plasma processing chamber having an electrostatic chuck assembly according to one embodiment of the present invention.

FIG. 1 is a sectional side view of a plasma processing chamber 100 having an electrostatic chuck assembly 120 according to one embodiment of the present invention. The plasma processing chamber 100 includes a chamber housing assembly 101 defining an inner volume 110. The chamber housing assembly 101 includes chamber walls 104, a chamber lid 102 disposed over the chamber walls 104, and a chamber bottom 105.

The electrostatic chuck assembly 120 is disposed in the inner volume 110 of the housing assembly 101 to support a substrate 112 thereon. The electrostatic chuck assembly 120 may be attached to housing assembly 101 via an interfacing plate 108, and may extend outside of the plasma processing chamber 100 via a bottom opening 106 formed through the chamber bottom 105.

A liner 130 may be disposed inside the chamber sidewalls 104 surrounding a portion of the inner volume 110 above the electrostatic chuck assembly 120 to create a processing volume 132 above the substrate 112. A slit valve opening 104a is formed through the chamber walls 104 and a corresponding opening 130a formed through the liner 130 to allow passage of substrates and substrate transfer mechanism used to place and retrieve substrates from the electrostatic chuck assembly 120.

A gas injection assembly 134 is disposed over the electrostatic chuck assembly 120 to provide one or more processing gas from a gas source 136 to the processing volume 132. A vacuum pump 140 may be coupled to the inner volume 110 to pump processing gases out of the plasma processing chamber 100 via a plenum 138 disposed in an edge region of the processing volume 132.

In one embodiment, an antenna assembly 142 may be disposed outside the chamber lid 102 to facilitate plasma processing. The antenna assembly 142 may be coupled to a radio-frequency (RF) plasma power source 146 through a matching network 144. During processing, the antenna assembly 142 is energized with RF power provided by the power source 146 to ignite a plasma of processing gases within the processing volume 132 and to maintain the plasma.

The electrostatic chuck assembly 120 includes a dielectric chuck body 121 configured to secure and support the substrate 112 and a cooling base 126 configured to provide temperature control of the dielectric chuck body 121. The dielectric chuck body 121 includes a substrate supporting plate 122 having a top surface 123 for supporting the substrate 112 and a back surface 125 opposing the top surface 123. The dielectric chuck body 121 also includes a shaft 124 extending from the back surface 125 of the substrate supporting plate 122. The shaft 124 is fixedly attached to the substrate support plate 122 at a first end 124a and attached to the cooling base 126 at a second end 124b. According to one embodiment of the present invention, the dielectric chuck body 121 and the cooling base 126 do not have additional fixed connections, such as clamping elements around the substrate support plate 122, other than the connection at the second end 124b of the shaft 124. This configuration allows the dielectric chuck body 121 and the cooling base 126 to move relative to one another under thermal expansion, therefore, avoids thermal stress between the dielectric chuck body 121 and the cooling base 126. Since the dielectric chuck body 121 and the cooling base 126 are connected at a center of the dielectric chuck body 121, the dielectric chuck body 121 is free to expand radially in all directions relative the cooling base 126. The contact between the second end 124b and the cooling base 126 provides primary heat exchange between the cooling base 126 and the dielectric chuck body 121.

The substrate supporting plate 122 is generally substantially planar and shaped to support the entire substrate 112. The substrate supporting plate 122 may be circular, rectangular or other suitable shape for supporting a circular substrate, a rectangular substrates, or substrates of other shapes. The substrate supporting plate 122 may be fabricated from ceramic, such as aluminum nitride, aluminum oxide, or doped ceramics such as alumina doped with titanium nitride or chromium nitride, doped aluminum oxide, doped boron-nitride and the like. In one embodiment, the substrate supporting plate 122 may be formed from about 95% pure aluminum nitride to enhance thermal conductivity of the substrate supporting plate 122.

The dielectric chuck body 121 further includes an electrode 156 embedded in the substrate supporting plate 122. The electrode 156 may be a thin metal plate or a metal mesh. The electrode 156 may be large enough to encompass substantially the entire area of the substrate 112. The electrode 156 may be coupled to a power source, such as a DC voltage source, to produce electrostatic chucking force to attract and secure the substrate 112 on the top surface 123. Optionally, the electrode 156 may also be coupled to a RF power source for generating capacitively coupled plasma in a processing chamber 100.

In one embodiment, the dielectric chuck body 121 further includes one or more heating elements 160 embedded in the substrate supporting plate 122. The one or more heating elements 160 may be resistive heaters. The one or more heating elements 160 enables the substrate supporting plate 122 to heat the substrate 112 to a desired temperature, for example, a temperature between about 200 to about 400 degree Celsius. In one embodiment, the one or more heating elements 160 may form two independently controlled temperature zones.

According to one embodiment of the present invention, three or more lift pins 116 may be movable through the substrate supporting plate 122, the cooling base 126, and the interface plate 108 by a lift pin drive 114. The three or more lift pins 116 are configured to pick up the substrate 112 from the substrate supporting plate 122.

The shaft 124 may be fabricated from ceramics, such as aluminum nitride, aluminum oxide, or doped ceramics such as alumina doped with titanium nitride or chromium nitride, doped aluminum oxide, doped boron-nitride and the like. In one embodiment, the shaft 124 may be formed from about 95% pure aluminum nitride to enhance thermal conductivity. In one embodiment, the shaft 124 and the substrate supporting plate 122 may be fabricated from the same material. The shaft 124 may be joined to the substrate supporting plate 122 by bonding to form an integrated dielectric chuck body. In one embodiment, the shaft 124 may be joined to the substrate supporting plate 122 by explosion bonding. In one embodiment, the shaft 124 may be joined to the substrate supporting plate 122 by diffusion bonding. Alternatively, the shaft 124 may be joined to the substrate supporting plate 122 brazing, or other suitable bonding methods that can form an integrated dielectric chuck body.

The shaft 124 is hollow having a sidewall 170 defining a central opening 172 extending from the first end 124a to the second end 124b. In one embodiment, the central opening 172 is configured to provide a passage for connectors 157, 159, 161 that connect the electrode 156 to a power source 158 and the one or more heating elements 160 to a heating power source 162.

According to one embodiment of the present invention, one or more channels 174, 176 may be formed through the sidewall 170 of the shaft 124. The one or more channels 174, 176 may extend from the first end 124a to the second end 124b. When the shaft 124 is joined to the substrate supporting plate 122, the one or more channels 174, 176 connect and become integrated with channels 178, 180 in the substrate supporting plate 122 forming one or more passage for cooling fluid and/or sensor leads. The nature of the bond between the shaft 124 and the substrate support plate 122 provides a leak-free interface between the channels 174, 176 and the channels 178, 180. In one embodiment, the channel 176 may be a blind hole for receiving a sensor, such as a thermal couple, without exposing the sensor to the processing environment in the processing volume 132.

As shown in FIG. 1, the channel 174 connects the channel 178 in the substrate supporting plate 122 to a cooling fluid source 182. The channel 178 opens at the top surface 123 of the substrate supporting plate 122. The channel 174 and the channel 178 form a passage for supporting a cooling fluid, such as helium, from the cooling fluid source 182 to a backside of the substrate 112 to control substrate temperature. The channel 176 in the shaft 124 connects to the channel 180 in the substrate supporting plate 122 to form a passage for a sensor 186. The sensor 186 may be positioned in the substrate supporting plate 122 proximate the top surface 123. The sensor 186 may be connected to a controller 184 through a sensor lead 185 disposed in the channel 176 and the channel 180. Optionally, the sensor may be positioned at the end 124b of the shaft 124. In one embodiment, the sensor 186 is a temperature sensor configured to measure the temperature of the substrate 112 disposed over the substrate support plate 122.

The shaft 124 and the substrate supporting plate 122 are bonded together to make a leak-tight seal. In one embodiment, the shaft 124 and the substrate supporting plate 122 may be explosion bonded. The channels 174, 176 connect to the channel 178, 180 by integration without using any O-rings which may not be able to stand high temperatures. As a result, the integrated channels 174, 176, 178, 180 enable the electrostatic chuck body 120 to operate at temperatures above most O-ring's service temperature limits.

The cooling base 126 is disposed under the dielectric chuck body 121 in the inner volume 110. In one embodiment, the cooling base 126 is mounted on an interface plate 108 disposed on the chamber bottom 105. The cooling base 126 may have a body 188 having a substantially planar top surface 187 and a cylindrical extension 190 opposing the top surface 187. A recess 189 is formed from the top surface 187 for receiving the shaft 124 of the dielectric chuck body 121 and extends into the cylindrical extension 190. The cylindrical extension 190 may extend through the bottom opening 106 of the chamber bottom 105.

A plurality of cooling channels 194 are formed in the cooling base 126 for circulation of a cooling fluid. The cooling channels 194 may be in fluid communication with a cooling fluid source 196. The cooling base 126 may be fabricated from a thermally conductive material, in one embodiment, is fabricated from a metal, such as aluminum or stainless steel.

The facing surfaces of the cooling base 126 and the shaft 124 are clamped together, for example using a plurality of screws 133. In one embodiment, a washer 131 may be disposed between the shaft 124 and the cooling base 126 to ensure solid contact and good heat exchange between the cooling base 126 and the shaft 124.

When assembled, the second end 124b of the shaft 124 sits on a bottom surface 192 of the recess 189 of the cooling base 126 while the top surface 187 of the cooling base 126 and the back surface 125 of the substrate supporting plate 122 do not make direct contact. Similarly, a sidewall 191 of the recess 189 also does not contact the shaft 124 directly. A gap 127 is formed between the cooling base 126 and the dielectric chuck body 121 to allow relative thermal expansion.

Optionally, a secondary thermal contact between the cooling base 126 and the dielectric chuck body 121 may be established by a contact element 128 and a springing element 129 disposed between the cooling base 126 and the dielectric chuck body 121. In one embodiment, a groove 135 may be formed in the top surface 187 of the cooling base 126. The groove 135 may be placed and shaped corresponding to an edge region of the substrate supporting plate 122 to provide temperature control to the edge region of the substrate supporting plate 122. The springing element 129 is disposed in the groove 135. The contact element 128 is disposed over the springing element 129. The springing element 129 pushes the contact element 128 against the back surface 125 of the substrate supporting plate 122. The springing element 129 and contact element 128 provide a conductive path between the cooling base 126 and the substrate supporting plate 122 without applying any lateral and vertical motion restraints between the substrate supporting plate 122 and the cooling base 126. The contact element 128 and the springing element 129 may be formed from thermal conductive materials. In one embodiment, the contact element 128 is formed from ceramic material, such as aluminum oxide or aluminum nitride. The springing element 129 may be formed from metal, such as aluminum or stainless steel.

According to one embodiment of the present invention, an edge ring assembly 150 may be disposed around the gap 127 to isolate the gaps 127 and 189 from the processing volume 132. The edge ring assembly 150 may include a lower ring 151 and an upper ring 152. The lower ring 151 may be disposed over the cooling base 126 surrounding the gap 127. The upper ring 152 may be supported by an edge of the substrate supporting plate 122 and suspended above the lower ring 151. A gap 150a may is formed between a lower surface 152a of the upper ring 152 and an upper surface 151a of the lower ring 151 to allow thermal expansion of the cooling base 126 and the dielectric chuck body 121. The lower surface 152a of the upper ring 152 and the upper surface 151a of the lower ring 151 may have interleaving features, such as a rib and a groove, that form a labyrinth in the gap 150a. The labyrinth in the gap 150a provides separation between the gap 127 and the processing volume 132. The labyrinth substantially prevents processing gas in the processing volume 132 from entering the gaps 127, 189 thus reducing undesirable contamination. The lower ring 151 and upper ring 152 may be formed from material compatible to the processing chemistry. In one embodiment, the lower ring 151 and upper ring 152 may be fabricated from ceramic or quartz. A shadow ring 154 may be disposed over the substrate supporting plate 122 around an edge region to cover areas outside the substrate 112 and prevent the covered areas from exposure to the processing chemistry.

Figure 2:
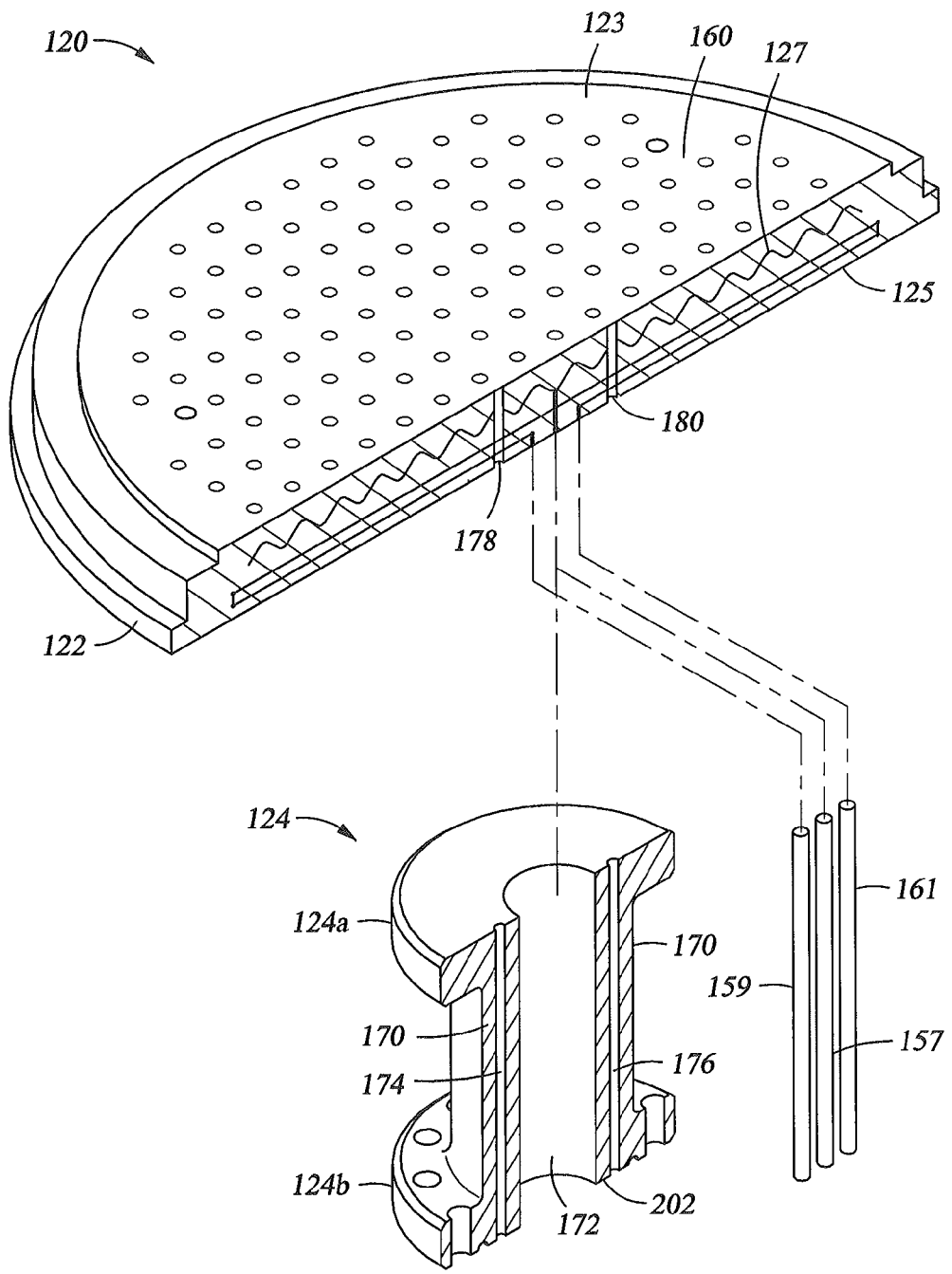
FIG. 2 is an exploded perspective sectional view of a chuck body according to one embodiment of the present invention.

FIG. 2 is an exploded perspective sectional view of the dielectric chuck body 120. The channels 174, 176 in the sidewall 170 form integrated passages for cooling fluid and/or sensor leads. Even though two channels 174, 176 are shown in FIG. 2, more channels may be formed to accommodate additional needs. The shaft 126 has a flange 202 that provides increased surface area for enhancing heat exchange with the cooling base 126.

Figure 3:
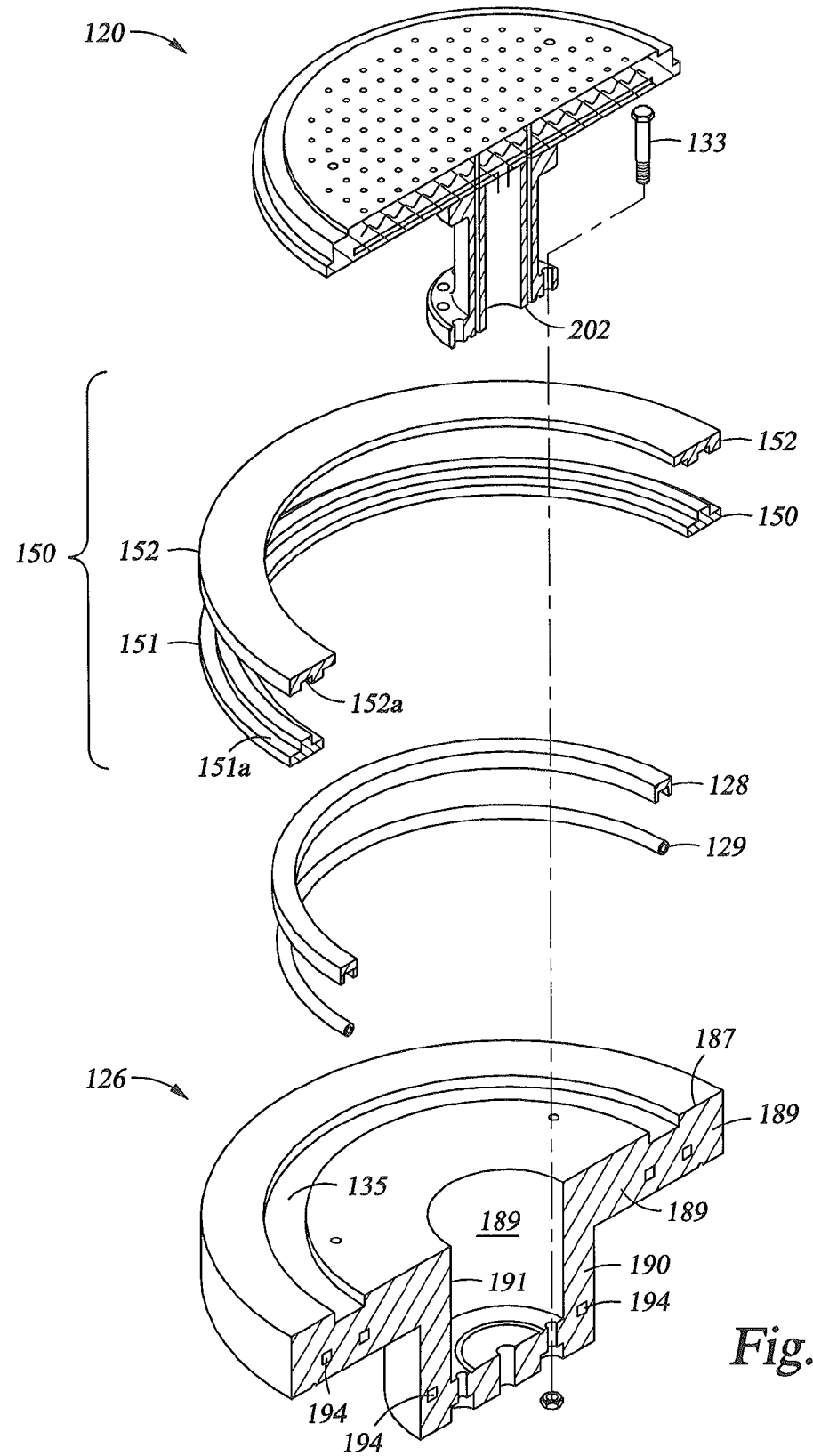
FIG. 3 is an exploded perspective sectional view of an electrostatic chuck assembly according to one embodiment of the present invention.

FIG. 3 is an exploded perspective sectional view of the electrostatic chuck assembly including the cooling base 126 and the dielectric chuck body 120, illustrating the components discussed above.

While the foregoing is directed to embodiments of the present invention, other and further embodiments of the invention may be devised without departing from the basic scope thereof, and the scope thereof is determined by the claims that follow.

The invention claimed is:

1. A dielectric chuck body for an electrostatic chuck, comprising:
a substrate supporting plate having a top surface for receiving a substrate, a back surface opposing the top surface;
an electrode embedded in the substrate supporting plate; and
a shaft having a first end attached to the back surface of the substrate supporting plate and a second end opposing the first end, wherein the second end is configured to contact a cooling base and provide temperature control to the substrate supporting plate and wherein the shaft is configured to be laterally spaced-apart from the cooling base, the shaft being hollow and having a sidewall enclosing a central opening, and two or more channels formed through the sidewall and extending from the first end to the second end, and wherein the shaft is configured to support the substrate supporting plate above the cooling base in a spaced-apart relation.

2. The dielectric chuck body of claim 1, further comprising one or more heating elements embedded in the substrate supporting plate and configured to heat the substrate disposed on the top surface.

3. The dielectric chuck body of claim 2, wherein the one or more heating elements form two or more independent heating zones.

4. The dielectric chuck body of claim 2, further comprising connectors disposed in the central opening of the shaft, wherein the connectors are coupled to the one or more heating elements and the electrode and are adapted to connect the one or more heating elements and the electrode to external power sources.

5. The dielectric body of claim 1, wherein the substrate support plate and the shaft are bonded together to form leak-tight channels therebetween.

6. The dielectric chuck body of claim 5, wherein the substrate supporting plate and the shaft are fabricated from ceramic.

7. The dielectric chuck body of claim 1, wherein the substrate supporting plate has a cooling channel configured to provide a cooling fluid to the substrate.

8. The dielectric chuck body of claim 7, further comprising a temperature sensor disposed in the substrate supporting plate, wherein the temperature sensor is configured to measure temperature of the substrate disposed on the substrate supporting plate, and a sensor lead passes through one of the two or more channels formed through the sidewall of the shaft.

9. The dielectric chuck body of claim 1, wherein the shaft has a flange formed on the second end for effective heat exchange with the cooling base.

10. An electrostatic chuck assembly, comprising:
a dielectric chuck body of claim 1; and
a cooling base configured to provide temperature control to the dielectric chuck body, wherein the cooling base and the dielectric chuck body are coupled together at the second end of the shaft of the dielectric chuck body, and a gap is formed between the back surface of the substrate supporting plate and a top surface of the cooling base.

11. The electrostatic chuck assembly of claim 10, wherein the cooling base comprises a body having a recess formed therein, and a bottom surface of the recess contacts the shaft of the dielectric chuck body.

12. The electrostatic chuck assembly of claim 11, further comprising:
a contact element; and
a springing element, wherein the contact element and the springing element span the gap between the cooling base and the substrate supporting plate, and provides a conductive path between the cooling base and the back surface of the substrate supporting plate.

13. The electrostatic chuck assembly of claim 12, the substrate support plate and the shaft are bonded together to form leak-tight channels therebetween.

14. The electrostatic chuck assembly of claim 12, wherein the substrate supporting plate has a cooling channel configured to provide a cooling fluid to the substrate.

15. The electrostatic chuck assembly of claim 10, wherein the substrate supporting plate and the shaft are fabricated from ceramic.

16. The electrostatic chuck assembly of claim 15, wherein the edge ring assembly comprises:
a lower ring disposed over the cooling base; and
an upper ring supported by the substrate supporting plate, wherein the upper ring is suspended over the lower ring, a lower surface of the upper ring faces an upper surface of the lower ring, interleaving features are formed in the lower surface of the upper ring and the upper surface of the lower ring, and the interleaving features form a labyrinth between the lower ring and the upper ring.

17. The electrostatic chuck assembly of claim 10, further comprising a conductive structure disposed between the cooling base and the shaft of the dielectric chuck body.

18. An apparatus for processing a substrate, comprising:
a chamber housing assembly defining an inner volume;
an electrostatic chuck assembly of claim 10 disposed in the inner volume and configured to secure and support a substrate in the inner volume during processing; and
a gas injection assembly configured to deliver one or more processing gas over the substrate disposed on the electrostatic chuck assembly.

19. The apparatus of claim 18, further comprising a liner disposed inside the chamber housing assembly surrounding a portion of the inner volume above the electrostatic chuck assembly to create a processing volume above the substrate.

20. The apparatus of claim 18, further comprising a shadow ring disposed over an edge region of the substrate supporting plate to protect the edge region of the substrate supporting plate.

21. The apparatus of claim 1, wherein the shaft extends through the cooling base.

\* \* \* \* \*